(12) United States Patent
Tsironis

(10) Patent No.: US 11,428,771 B1
(45) Date of Patent: Aug. 30, 2022

(54) LOW PROFILE HIGH SPEED LOAD PULL TUNER SYSTEM

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 309 days.

(21) Appl. No.: 16/863,182

(22) Filed: Apr. 30, 2020

(51) Int. Cl.
| | | |
|---|---|---|
| *H03H 7/40* | (2006.01) | |
| *G01R 35/00* | (2006.01) | |
| *H01P 5/04* | (2006.01) | |
| *H03H 7/38* | (2006.01) | |
| *G01R 27/32* | (2006.01) | |
| *G01R 1/26* | (2006.01) | |
| *G01R 31/28* | (2006.01) | |

(52) U.S. Cl.
CPC ............ *G01R 35/005* (2013.01); *G01R 1/26* (2013.01); *G01R 27/32* (2013.01); *H01P 5/04* (2013.01); *H03H 7/38* (2013.01); *H03H 7/40* (2013.01); *G01R 31/2822* (2013.01)

(58) Field of Classification Search
CPC .. H01P 5/04; H01P 1/182; H03H 7/38; H03H 7/40; H04L 25/0278; G01R 1/26; G01R 1/24; G01R 35/005; G01R 27/32; G01R 27/28; G01R 31/2822; G01R 31/282; G01R 31/2601
USPC ........................................................ 333/263
See application file for complete search history.

(56) References Cited

U.S. PATENT DOCUMENTS

| | | |
|---|---|---|
| 5,910,754 A | 6/1999 | Simpson |
| 6,674,293 B1 | 1/2004 | Tsironis |
| 6,854,162 B2 | 2/2005 | Emerson |
| 7,595,709 B1 | 9/2009 | Boulerne |
| 8,188,816 B1 * | 5/2012 | Tsironis ............... H01P 5/04 333/263 |
| 9,257,963 B1 | 2/2016 | Tsironis |
| 9,625,556 B1 | 4/2017 | Tsironis |
| 10,345,422 B1 * | 7/2019 | Tsironis ............... H03H 7/40 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
Linear Actuator [online], Wikipedia [retrieved on Apr. 25, 2020] Retrieved from Internet <URL: https://en.wikipedia.org/wiki/Linear_actuator>.

(Continued)

Primary Examiner — Stephen E. Jones

(57) ABSTRACT

A load-pull test system uses controller, interface, calibration method and at least one low profile, two-probe, slide screw impedance tuner; the tuner probes share the same slabline; they are inserted anti-diametrical at fixed depth (distance from the center conductor) from both sides into the channel and move only horizontally along the slabline. The tuner does not have adjustable high precision vertical axes controlling the penetration of the probes and its low profile is optimized for on-wafer operations. The carriages holding the probes are moved at high speed along the slabline using linear electric actuators. An efficient de-embedding calibration method serves speeding up additionally the measurement procedure.

7 Claims, 11 Drawing Sheets

(56) References Cited

OTHER PUBLICATIONS

"Lecture 20: Transmission (ABCD) Matrix" [online], EE 481/581—Microwave Engineering, Course Syllabus [retrieved an Jul. 13, 2015] Retrieved from Internet <URL: http://whites.sdsmt.edu/classes/ee481/notes/481Lecture20>.

Tsironis C., U.S. Appl. No. 16/250,254, filed Jan. 17, 2019, "Integrated Pre-matching module for Impedance tuner", FIG. 13.

\* cited by examiner

LOW PROFILE HIGH SPEED LOAD PULL TUNER SYSTEM

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load pull>
2. "Computer Controlled Microwave Tuner—CCMT", Product Note 41, Focus Microwaves January 1998.
3. Boulerne P., U.S. Pat. No. 7,595,709, Multiple-Carriage High Gamma Tuner", FIGS. 7 and 7' and Column 4 lines 63ff and column 5 lines 1-5.
4. Tsironis C., U.S. Pat. No. 6,674,293, "Adaptable Pre-Matched Tuner System and Method".
5. Tsironis C., U.S. patent application Ser. No. 16/250,254, filed Jan. 17, 2019, "Integrated Pre-matching module for Impedance tuner", FIG. 13.
6. Linear Actuator [online], Wikipedia [retrieved on Apr. 25, 2020] Retrieved from Internet <URL: https://en.wikipedia.org/wiki/Linear_actuator>
7. Tsironis C., U.S. Pat. No. 9,257,963, "Impedance Tuners with Rotating Probes", FIG. 15.
8. Tsironis C., U.S. Pat. No. 9,625,556, "Method for Calibration and Tuning with Impedance Tuners".
9. "Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>
10. Simpson, G. et al. U.S. Pat. No. 5,910,754, "Reduced height waveguide tuner for impedance matching", FIG. 8.
11. Tsironis, C. U.S. Pat. No. 8,854,162, "Method for preventing electrical short in impedance tuners using mechanical stop", FIGS. 8 to 14.

BACKGROUND OF THE INVENTION

This invention relates to RF load and source pull testing of medium and high power RF transistors and amplifiers using remote controlled electro-mechanical impedance tuners.

A popular method for testing and characterizing such microwave components (transistors) in the non-linear region of operation is "load pull" (see ref. 1). Load pull is a RF device measurement technique employing microwave impedance tuners and other microwave test equipment as shown in FIG. 1. The microwave tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which comprises electronic interface to communicate with the instruments 1, 5 and the tuners 2, 4 using digital control and communication cables 7, 8 and 9.

DESCRIPTION OF PRIOR ART

Two-probe impedance tuners comprise, in general, a low loss transmission line 30 (slabline), FIG. 3, and two conductive tuning elements (tuning probes, 31, 32 and FIG. 2); the probes 21 are attached 22 on complex adjustable high precision vertical axes 33, 34 (see ref. 10) and are inserted 26 into the slabline 24, approaching the center conductor 23 and moved 25 along the axis of the slabline; this movement of the tuning probes creates a controllable variable reactance, allowing the synthesis of various impedances (or reflection factors) covering parts, up to the quasi totality, of the Smith chart (the polar impedance mapping display showing the normalized reflection factor area). The relation between reflection factor T and impedance Z is given by $\Gamma=(Z-Zo)/(Z+Zo)$, where $Z=R+jX$ and Zo is the characteristic impedance. A typical value used for Zo is 50 $\Omega$.

When parallelepiped metallic tuning probes (slugs) 21, FIG. 2, with a concave bottom approach the center conductor 23, they capture and deform the electric field, which is concentrated in the area between the center conductor and the ground planes of the slabline 24. This field deformation allows creating the high and controllable reflection factors. The main disadvantage of this embodiment is the requirement of high precision and resolution and, by consequence, tall and cumbersome vertical 26 probe movement mechanisms 33, 34 (see ref. 10), because most of the field capturing effect occurs when the probe is very close to the center conductor (see FIG. 15 in ref. 7). This movement process slows down the tuning procedure for two reasons: (a) when the probe is away from the center conductor, the vertical probe movement is lengthy and much less effective, while the vertical moving speed is the same and (b) enhanced positioning accuracy and resolution is required all the way due to high tuning sensitivity in the high reflection area, when the probe is very close to the center conductor.

Related prior art (see ref. 3) does not teach fixed penetration tuning probes, thus requiring complex vertical axis. Neither relevant prior art reference 3 or 4 teaches a tuner calibration method for overlapping tuning probes (ref. 3 does not teach calibration method at all and ref. 4 does not teach calibration method for alternatively swapping tuning sections in a shared transmission slabline structure); this overlapping structure, though, is essential and compatible with the proposed low profile, compact tuner size and high speed de-embedding tuner calibration and operation (see ref. 8). The issue is that a full calibration would require, typically, measuring 100×100=10,000 points, whereas the herein disclosed de-embedding calibration requires only 100+100=200 points (50 times faster).

BRIEF SUMMARY OF THE INVENTION

The invention claims a slide screw load pull tuner system using a new tuner type. The configuration, different from prior art, uses horizontal-only high-speed tuning probe movement techniques and a preferred fast custom de-embedding calibration method. Once the tuner is properly calibrated, prior art impedance synthesis (tuning) methods are applicable (see ref. 8).

The tuner itself uses a low loss slabline, arranged flat on the side (FIG. 8), in order to reach a very low profile; such low profile tuners are needed for on-wafer integrations for avoiding a mechanical conflict with the microscope (see ref. 5). The tuning probes 86 are mounted using spring-loaded swiveling joints 88 on remotely controlled horizontally (along the slabline) moving carriages 83, 85 and penetrate into the channel between the slabline sidewalls 80 always at the same depth, or the same distance to the center conductor 84. This eliminates the need for an elaborate adjustable high precision vertical axis (see ref. 10).

The carriages are controlled using high-speed electric stepper actuators 81, 82, 87 (see ref. 6) thus eliminating also additional control gear. Last, not least, the tuning mechanism, liberated from cumbersome and expensive high resolution vertical probe control and movement delays, benefits also from inherent lower tuning error sensitivity to mechanical probe positioning tolerances close to $|\Gamma|\approx 1$.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 1:
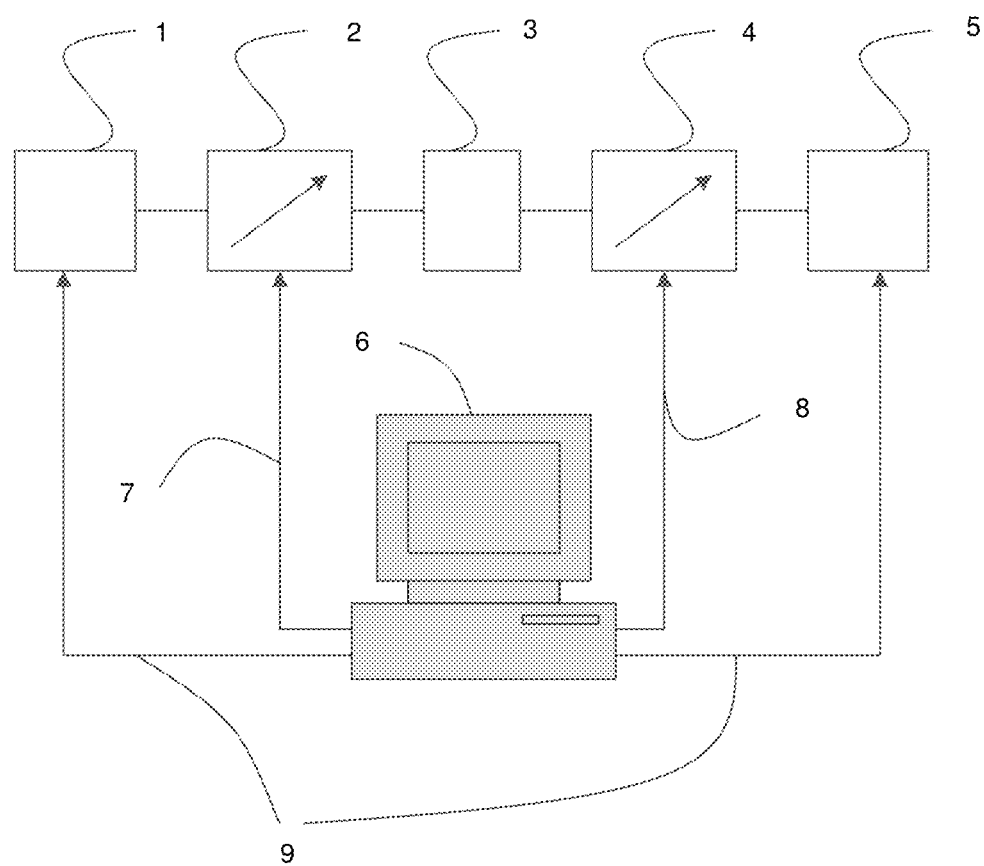
FIG. 1 depicts prior art: a typical automated load pull test system.
Figure 2:
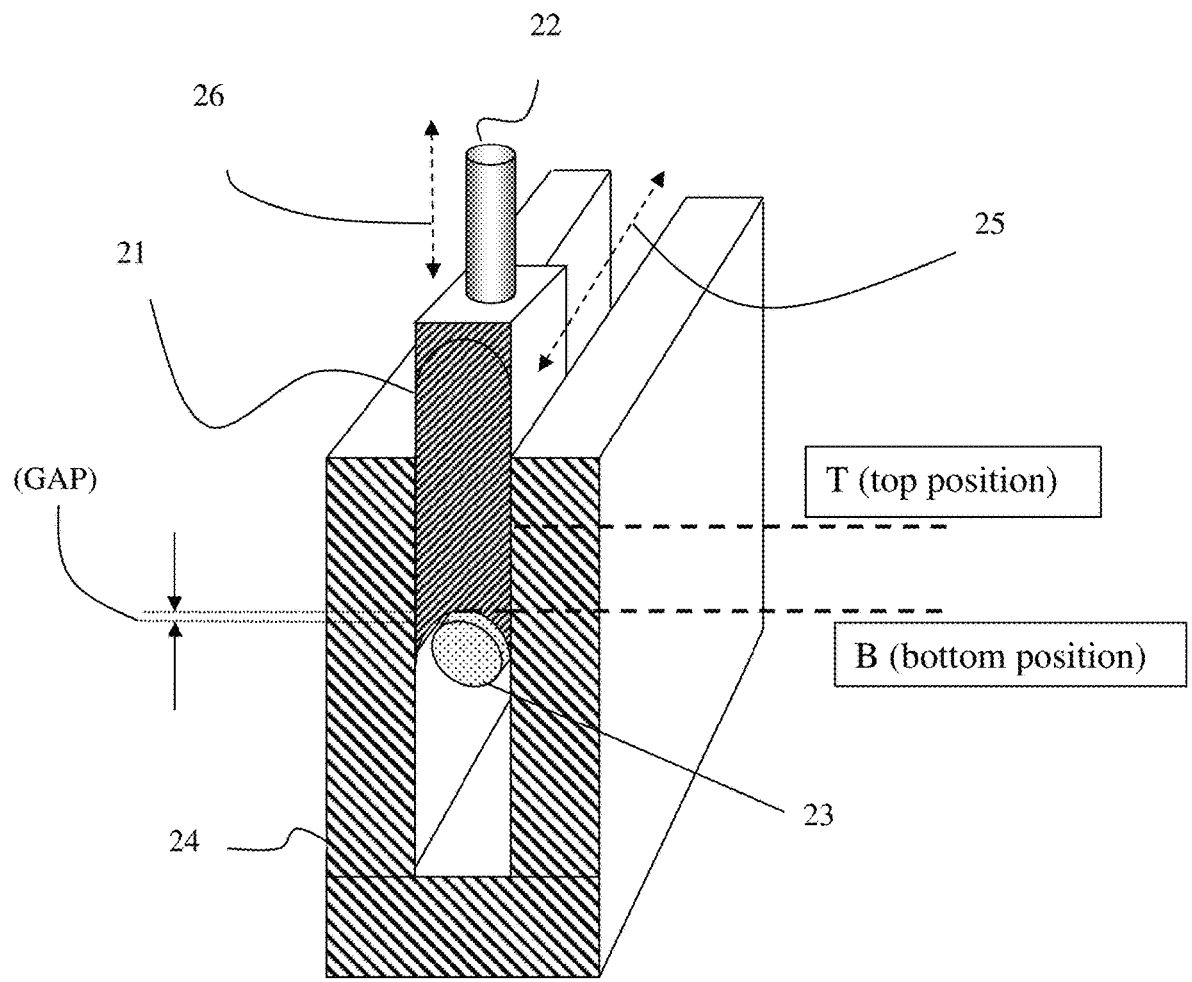
FIG. 2 depicts prior art: a perspective view of a vertically adjustable RF parallelepiped tuning probe (slug) and the relevant dimensions and parameters of the operation.
Figure 3:
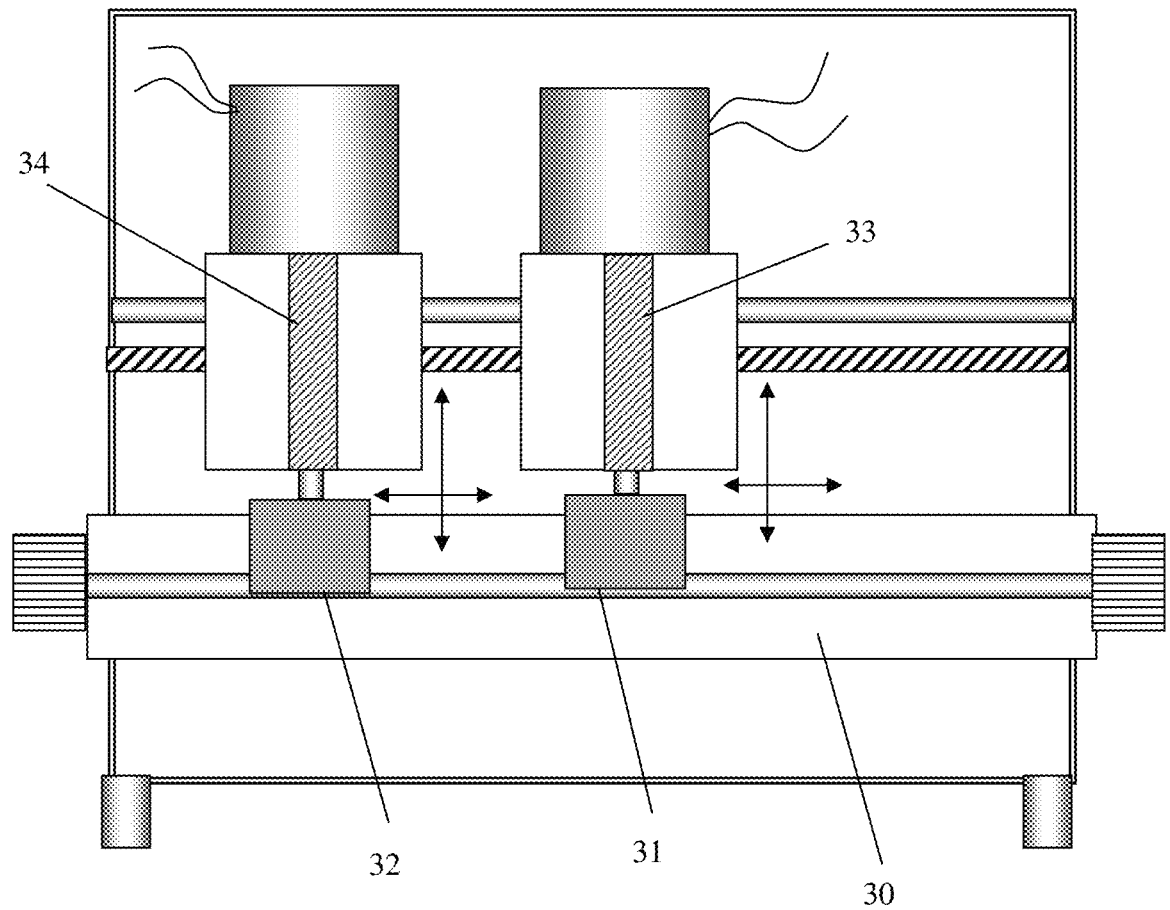
FIG. 3 depicts prior art: front view of a two-carriage/two-probe slide screw tuner.
Figure 4:
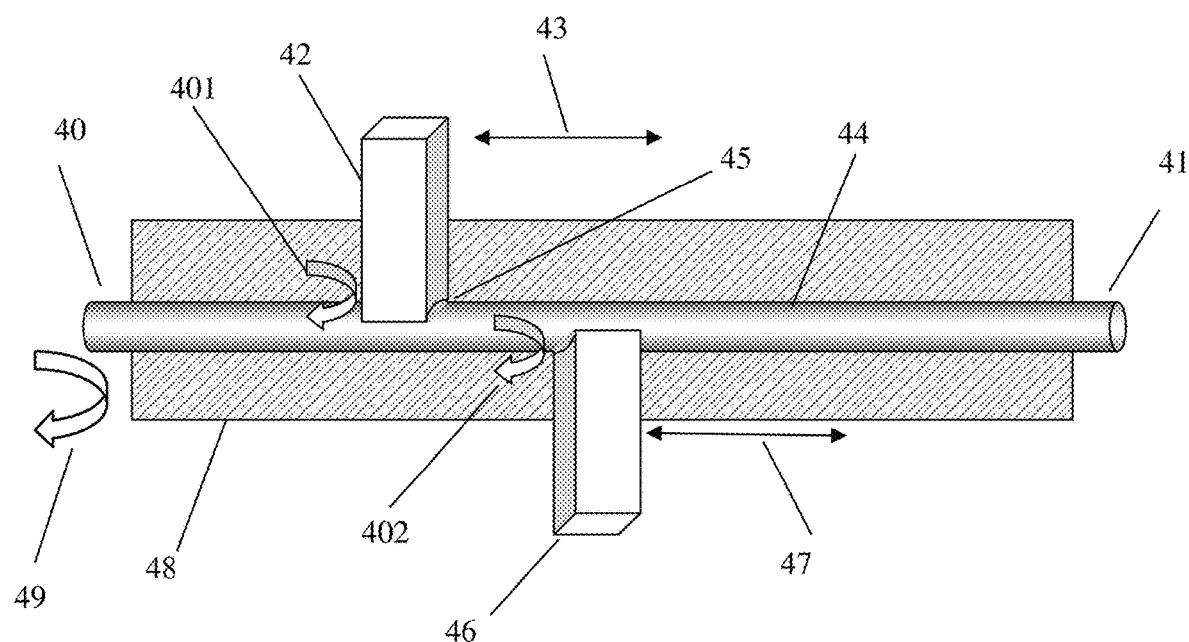
FIG. 4 depicts the concept of a shared-slabline fixed-penetration two-probe tuner.
Figure 8:
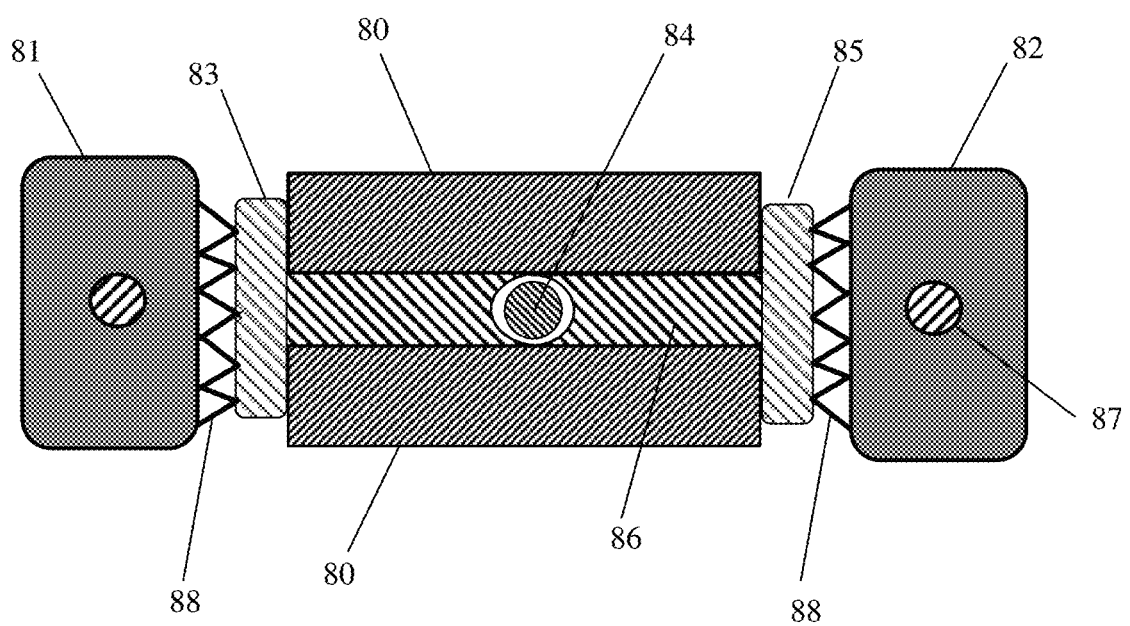
FIG. 8 depicts cross section of shared-slabline fixed-penetration two-probe tuner.

This invention discloses a radio frequency (RF, microwave), computer controlled impedance tuning system, suitable for load pull measurements, comprising at least one electro-mechanical impedance tuner and the calibration method thereof. The tuner (FIG. 4) uses a low loss transmission airline (slabline) 48, which includes two parallel conducting (metallic or metallized) sidewalls 80 (FIG. 8) forming a straight channel and a, typically but not exclusively, cylindrical center conductor 44, 84. The center conductor terminates at the two ends of the slabline, the test port 40 facing the DUT, and the idle port 41 facing the load. Two parallelepiped tuning probes 42 and 46 are inserted opposite (anti-diametric) to each-other from the top and the bottom (or from left and right) into the slabline channel at fixed depth 45 and can be moved only horizontally 43, 47 along the slabline; each probe creates at its own reference plane concentric reflection factor circles 401, 402 on the Smith chart (see FIG. 9). The total reflection factor 49 is created by a planetary epicycloid superposition of the two reflection factor vectors (one circle rotates around a point at the periphery of the other) and can be seen in FIG. 9 (also see ref. 4, FIG. 8b).

Figure 5:
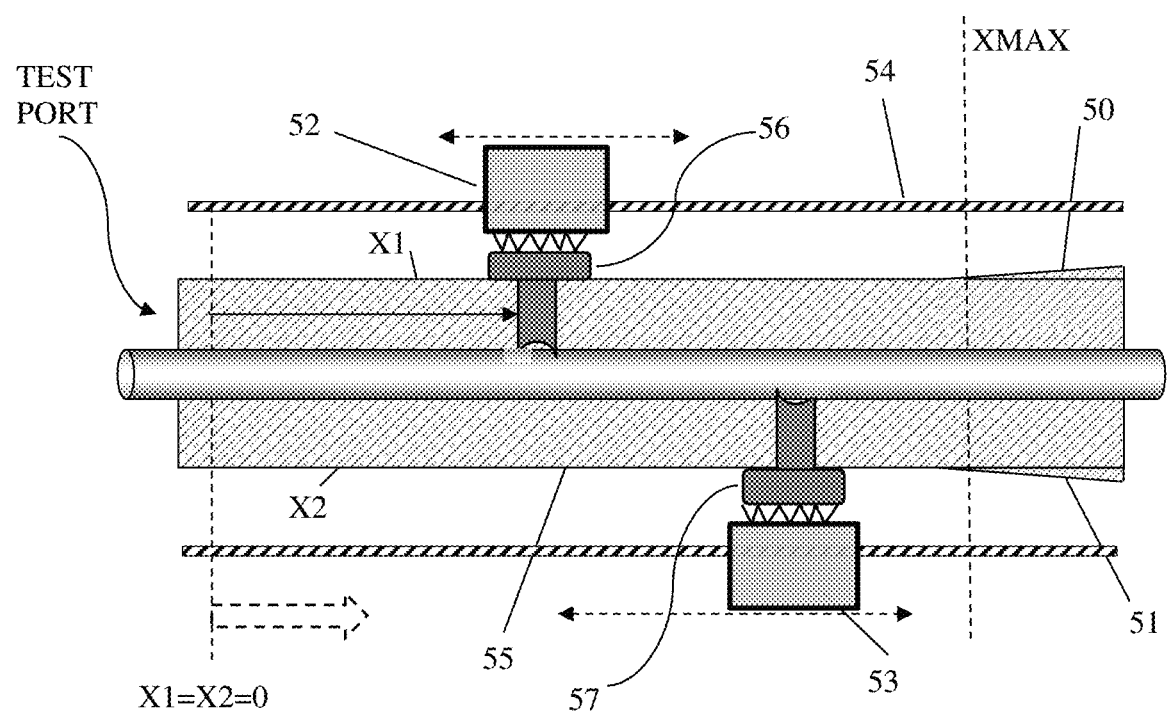
FIG. 5 depicts a detailed front view of the shared-slabline fixed-penetration two-probe tuner.
Figure 6:
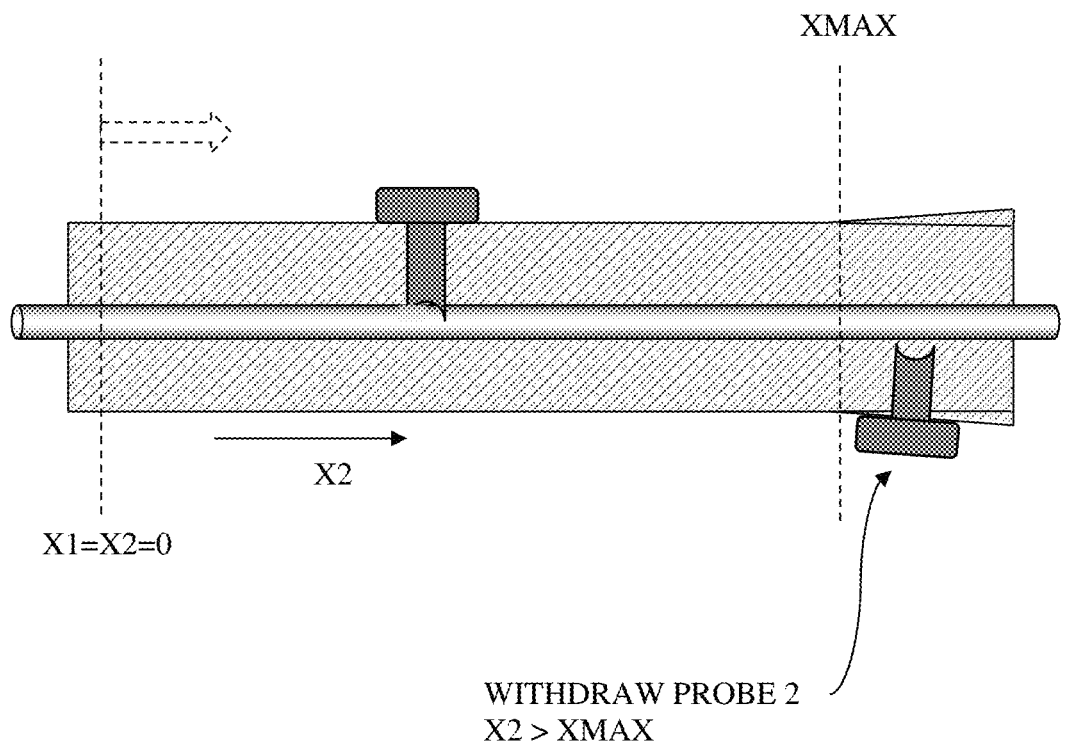
FIG. 6 depicts front view of shared-slabline fixed-penetration two-probe tuner with one withdrawn tuning probe.
Figure 7:
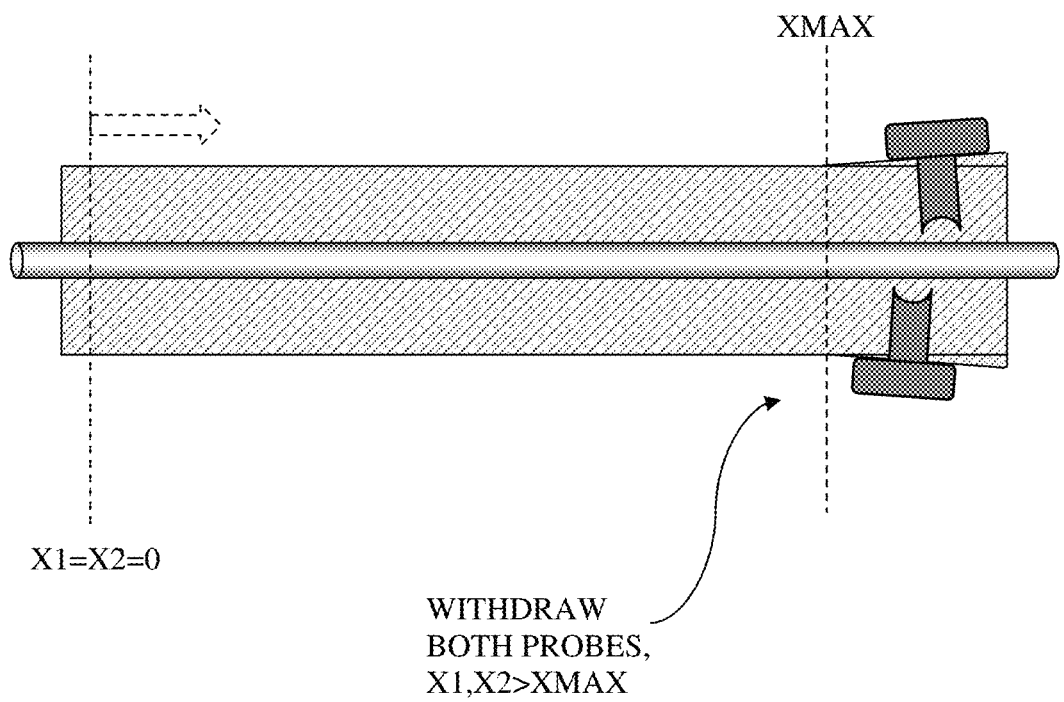
FIG. 7 depicts front view of shared-slabline fixed-penetration two-probe tuner with both withdrawn tuning probes.

The horizontal control of the carriages in the slabline 55 is best accomplished using linear electric actuators (see ref. 6). These have a motorized body 52, 53 and their motor axis is an associated horizontal ACME 54. Since the tuner does not have adjustable vertical axis, not being able to withdraw the tuning probes from the slabline, eliminates the possibility of a high speed de-embedding calibration, since the hereby required residual tuner zero matrix [S0] i.e. the s-parameters of the slabline itself including the coaxial port connectors, cannot be measured with the tuning probes inserted. Therefore, there must exist provision for simply withdrawing the probes without an elaborated vertical axis. One possible embodiment is shown in FIG. 5: Herein the slabline is extended, beyond the minimum length of XMAX=$\lambda$(Fmin)/2 by short ramped up sections 50 and 51 on top and bottom of both sidewalls, where the carriages are moved to, to allow the probes to withdraw completely (FIGS. 6 and 7) for reducing their residual effect on the return loss of the slabline and allow measuring the zero matrix [S0].

The mobile carriages 56 and 57 comprise a slider against the two slabline walls and a spring-loaded swiveling joint 88 (FIG. 8) between the carriage and the tuning probe, whereby the probe has a fixed penetration limitation mechanism and is pressed to slide against the top and bottom (or left and right) surface of the slabline walls (see ref. 11). The swiveling joint is necessary to allow for the probes to slide up the ramps 50 and 51 and been withdrawn; the fixed stop defines the level of penetration of the probes into the channel of the slabline and thus the pre-selected constant reflection factor of each probe. If the longer, full permutations calibration, is always to be used, the probes do not need to be withdrawn and the swiveling joint is not required.

Figure 9:
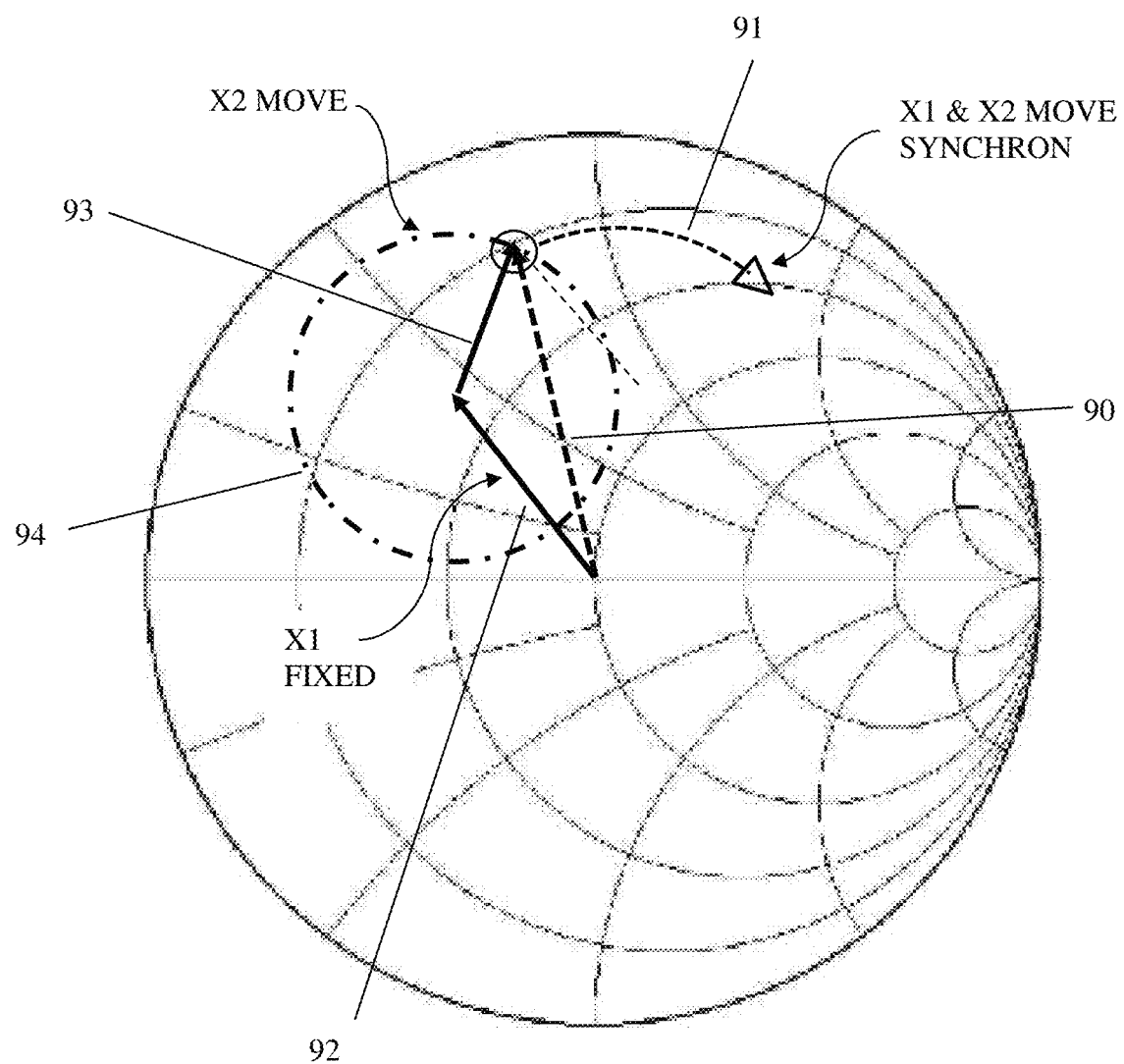
FIG. 9 depicts tuning mechanism of shared-slabline fixed-penetration two-probe tuner.

Reflection factor generation is shown in FIG. 9: Assuming probe 1 is closer to the test port, it generates a (fixed) vector 92; probe 2 creates a superimposed vector 93 which rotates around the tip of vector 92, following the trajectory 94, creates a total vector 90. If only probe 2 moves, then the total vector 90 follows trace 93; when both probes move together at the same pace then the total vector 90 follows trace 91 and if they both move at different paces it follows a Lissajous contour.

Figure 10:
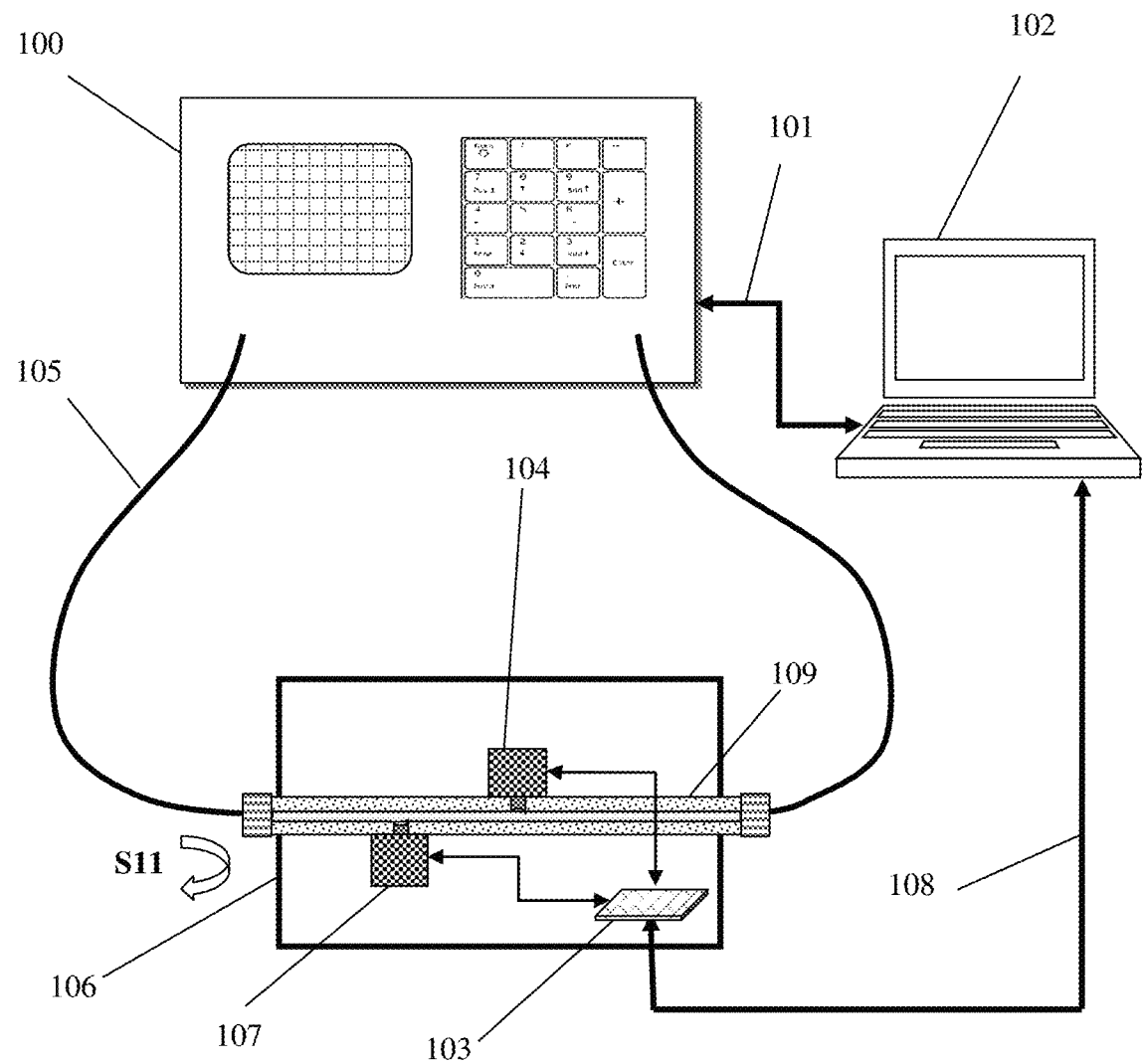
FIG. 10 depicts calibration setup of the tuner.
Figure 11:
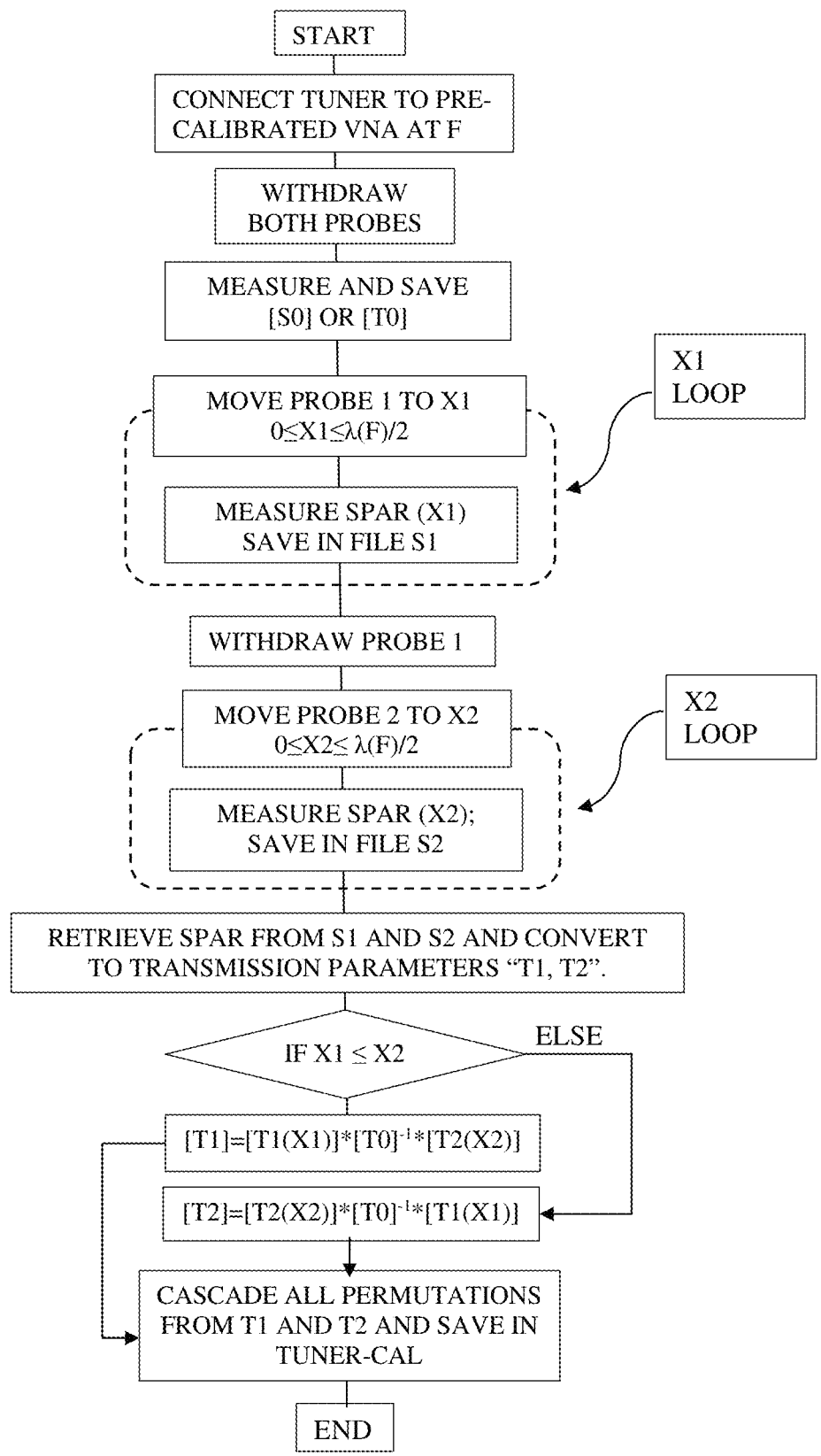
FIG. 11 depicts flowchart of the de-embedding calibration algorithm of the shared-slabline fixed-penetration two-probe tuner.

The tuner calibration process uses a setup as in FIG. 10 and is depicted, step by step, in the flowchart of FIG. 11: the tuner 106 is connected using RF cables 105 with a Vector Network Analyzer (VNA) 100 pre-calibrated at the frequencies of interest. The actuators 104 and 107 are controlled by the control computer 102 using a digital cable 108 via the electronic control board 103 to move the carriages 104 and 107, which slide along the axis of the slabline 109, in order to control the reflection factor S11, while reading the four scattering parameters (s-parameters) from the VNA 100 using standard digital communication cable 101 and communication protocol. The computer 102 includes a temporary RAM and a permanent (hard-disc) electronic memory for saving probe positions and the associated s-parameters in calibration data files for later use. The PC 102 also comprises and runs appropriate tuner and VNA control and communication software as well as appropriate numerical data processing (s-parameter matrix conversion and cascading) routines.

The fast de-embedding calibration procedure comprises the following steps (FIG. 11): After the tuner is connected to the VNA, pre-calibrated at a selected frequency F inside the operation range of the tuner, both tuning probes are withdrawn from the slabline; this leaves the residual slabline (tuner) between the test and idle ports. S-parameters of the residual tuner are measured and saved in a zero matrix [S0]. Then the first tuning probe 1 is inserted into the channel of the slabline at a fixed depth (distance from the center conductor), corresponding to a desired reflection factor S11, typically, but not necessarily, close to 0.7 and is moved to the designated (limit switch defined) horizontal zero position (initialized), which, preferably, but not necessarily, is close to the test port (the port closest to the DUT); then probe 1 is moved away from the zero position to a number of positions X1=0, X1.1, X1.2 ... X1.i ... X1.N not exceeding XMAX; in fact the required maximum distance from the test port depends on the operation frequency and is one half of a wavelength ($\lambda$(F)/2); at each position X1.i s-parameters are measured and saved in the format {X1.i, 511,512,521,522} in a file S1. Then probe 1 is withdrawn and probe 2 is inserted into the channel at a fixed depth (distance from the center conductor), similar to probe 1, and is moved to the horizontal zero position; subsequently probe 2 is moved to horizontal positions X2=0, X2.1, X2.2 ... X2.i ... X2.M not exceeding XMAX, and s-parameters are measured and saved, using the same format as before, in file S2; the distance between horizontal X positions is selected to create small phase changes (typically between 2.5 and 10 degrees between stops); in the first case the number of stops M or N is 144 (360/2.5) and in the second case 36 (360/10); files S1 and S2 include s-parameters of the tuner with S11 describing approximate concentric circles with each probe moved separately to horizontal positions X1.i or X2.i, while the other probe is withdrawn. In a following step s-parameters associated with the movement of each probe are cascaded (matrix multiplied after converted to transfer ABCD matrices, see ref. 9) as follows: for all permutations M*N, if X1≤X2 then the invers zero matrix [S0]$^{-1}$ is cascaded with the s-parameters of file S2 and re-saved in file S2 and if X1>X2 then the invers zero matrix [S0]$^{-1}$ is cascaded with the s-parameters of file S1 and re-saved in file S1. Subsequently all M*N permutations of s-parameters in updated files S1 and S2 are cascaded and saved in an overall tuner calibration file TUNER-CAL comprising M*N s-parameter sets in the format (X1, X2, Sij) for {i,j}={1,2}. The time needed for this calibration is reduced by a factor of approximately M*N/(M+N) or, if M=N by a factor N/2, over the below described "brute force" calibration of all permutations.

Alternatively to the fast de-embedding calibration method, a "brute force" calibration method can be used, comprising measuring all permutations of all probe positions. In this case withdrawing the probes is not required, which simplifies the design, for the price of requiring a multiple of calibration time. In this case one probe is moved to each of a multitude of horizontal positions from zero to $\lambda$/2, and, at each position of this probe, the other probe is moved to all positions from zero to $\lambda$/2, and s-parameters are measured and saved in the final calibration file TUNER-CAL. Assuming each move-measure step takes 2 seconds and we choose M=N=100 positions, then the brute force calibration will last 20,000 seconds or 5.6 hours, whereas the previously described de-embedding calibration would last 400-450 seconds (accounting also for probe withdrawal/initialization actions) or between 6.7 and 7.5 minutes. The time difference is significant in favor of the de-embedding calibration. The choice of M and N is a sensitive matter. If chosen too low the interpolation between calibrated points becomes inaccurate and so does the tuning accuracy. The number 100 for both M and N is a recommended value.

Obvious alternatives to the disclosed concept of a load pull system using a tuner with two independent fixed-insertion tuning probes without adjustable vertical axis, sharing, anti-diametrically mounted, the same slabline, shall not impede on to the validity of the present invention.

What is claimed is:

1. A load-pull tuner system comprising
   a) an automated two-probe slide screw tuner,
   b) a system controller, and
   c) a calibration method,
   wherein
      a) the slide screw tuner comprises
         a low loss slotted airline (slabline) having an input port, an output port, two sidewalls forming a channel, and a center conductor, and
         two remotely controlled mobile carriages 1 and 2, mounted anti-diametric to each-other on top and bottom of the sidewalls across the channel, moving along the slabline and holding each a tuning probe, said tuning probes sharing the same section of the slabline,
      wherein
         the tuning probes are inserted anti-diametric into the channel at fixed
         distances from the center conductor,
      and wherein
         carriage 1 moves probe 1 to position X1, and
         carriage 2 moves probe 2 to position X2;
      b) the system controller comprises
         a central processor, electronic memory, electronic interface for motion control of the carriages and communication, instrument control and data collection software;
      c) the calibration method comprises
         tuner-control, s-parameter acquisition routines and data processing algorithms.

2. The slide screw tuner of the load-pull tuner system of claim 1,
   wherein the tuning probes can be withdrawn from the channel of the slabline.

3. The slide screw tuner of the load-pull tuner system of claim 1 or 2, comprising communication interface, electronic board, electric stepper motors and gear for controlling the position of the carriages along the slabline.

4. The slide screw tuner of claim 1 or 2,
   wherein
      the total length XMAX of the slabline is at least one half of a wavelength at the minimum operation frequency (Fmin).

5. The calibration method of the load-pull tuner system of claim 2, comprising the following steps:
   d) connect the tuner to a pre-calibrated VNA at a frequency F;
   e) withdraw both tuning probes;
   f) measure s-parameters and save in zero matrix [S0];
   g) in a {X1} loop for 0≤X1≤$\lambda$(F)/2
      i) move tuning probe 1 to X1;
      ii) measure s-parameters Si,j; {i, j}={1,2};
      iii) save (X1, Si,j) in file S1;
   h) withdraw tuning probe 1;
   i) in a {X2} loop for 0≤X2≤$\lambda$(F)/2
      i) move tuning probe 2 to X2;
      ii) measure s-parameters Si,j; {i, j}={1,2};
      iii) save (X2, Si,j) in file S2;
   j) if (X1≤X2) then
      a) cascade the invers s-parameter zero matrix [S0]$^{-1}$ with the s-parameters of file S2 and replace in file S2;
      b) cascade the s-parameters of S1 with the s-parameters of S2 and save (X1,X2,Si,j) in file TUNER-CAL;
      else if (X1>X2) then
      c) cascade the invers s-parameter zero matrix [S0]$^{-1}$ with the s-parameters of file S1 and replace in file S1;
      d) cascade the s-parameters of S2 with the s-parameters of S1 and save (X1, X2, Si,j) in file TUNER-CAL for later use.

6. The calibration method of the load-pull tuner system of claim 1, comprising the following steps:
  a) connect the tuner to a pre-calibrated VNA at a frequency F;
  b) in a {X1} loop for $0 \leq X1 \leq \lambda(F)/2$
     i) move tuning probe 1 to X1;
     ii) in a {X2} loop for $0 \leq X2 \leq \lambda(F)/2$ iii) move tuning probe 2 to X2;
     iv) measure s-parameters $S_{i,j}$; $\{i, j\}=\{\mathbf{1,2}\}$;
     v) save (X1, X2, $S_{i,j}$) in file TUNER-CAL;
     when the {X2} loop terminates, increase X1 and go to step i);
  c) when the {X1} loop terminates, save file TUNER-CAL for later use.

7. An automated two-probe slide screw tuner comprising a low loss slotted airline (slabline) having an input (test) port, an output (idle) port, two sidewalls forming a channel, and a center conductor, and two remotely controlled mobile carriages 1 and 2, mounted anti-diametric to each-other on top and bottom of the sidewalls across the channel, moving along the slabline and holding each a tuning probe, said tuning probes sharing the same section of the slabline,
wherein
  the tuning probes are inserted anti-diametric into the channel at fixed distances from the center conductor,
and wherein
  carriage 1 moves probe 1 to a position X1, and
  carriage 2 moves probe 2 to a position X2;
and wherein
  the tuning probes are attached to the mobile carriages using a swiveling joint, and the slabline is extended, beyond a maximum distance XMAX=$\lambda/2$ from the test port at the minimum frequency of operation, by short ramped up sections allowing the tuning probes to be withdrawn when the carriages move beyond XMAX.

* * * * *